(12) United States Patent
Oh (10) Patent No.: US 8,227,327 B2
(45) Date of Patent: *Jul. 24, 2012

(54) METHOD FOR EPITAXIAL GROWTH

(75) Inventor: Jae-eung Oh, Ansan (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 285 days.

This patent is subject to a terminal disclaimer.

(21) Appl. No.: 12/388,056

(22) Filed: Feb. 18, 2009

(65) Prior Publication Data

US 2010/0184278 A1   Jul. 22, 2010

(30) Foreign Application Priority Data

Jan. 22, 2009   (KR) .................... 10-2009-0005363

(51) Int. Cl.
*H01L 21/20* (2006.01)
(52) U.S. Cl. ... 438/492; 438/607; 438/962; 257/E21.09; 257/E21.097; 117/9; 117/54
(58) Field of Classification Search .................. 438/222, 438/226, 413, 416, 442, 481, 492, 497, 500, 438/502, 607, 765, 903, 962; 257/E21.09, 257/E21.092, E21.097, E21.404, E21.108, 257/E29.071, E33.005; 117/9, 10, 16, 54
See application file for complete search history.

(56) References Cited

U.S. PATENT DOCUMENTS

| 6,103,600 A * | 8/2000 | Ueda et al. .................. 438/503 |
| 6,653,166 B2 * | 11/2003 | Ledentsov .................... 438/77 |
| 7,554,109 B2 * | 6/2009 | Stokes et al. .................. 257/17 |
| 2004/0094084 A1 * | 5/2004 | Ouchi et al. ..................... 117/2 |
| 2005/0051766 A1 * | 3/2005 | Stokes et al. .................. 257/17 |

FOREIGN PATENT DOCUMENTS

| JP | 11-354843 | * 12/1999 |
| JP | 1999-354839 A | 12/1999 |
| JP | 1999-354843 A | 12/1999 |
| JP | 3667995 A | 4/2005 |
| KR | 10-0833897 | * 5/2007 |

OTHER PUBLICATIONS

Satoru Tanaka, Sohachi Iwai and Yoshinobu Aoyagi, Self-assembling GaN quantum dots on $Al_xGa_{1-x}N$ surfaces using a surfactant, American Institute of Physics, Dec. 23, 1996, Appl. Phys. Lett.69, pp. 4096-4098.

* cited by examiner

*Primary Examiner* — Julio J Maldonado
*Assistant Examiner* — Su Kim
(74) *Attorney, Agent, or Firm* — Kile Park Goekjian Reed & McManus PLLC (57) ABSTRACT

There is provided a method for epitaxial growth, wherein a quantum dot is formed on an epitaxial layer using a quantum-dot forming material with an excellent lattice matching property, and the formed quantum dot is positioned on a defect in the epitaxial layer, thereby minimizing transfer of the defect into an epitaxial layer formed through a subsequent process. The method includes preparing a first epitaxial layer having a defect formed therein; coating an anti-surfactant on the first epitaxial layer; supplying a quantum-dot forming material lattice-matched with respect to the first epitaxial layer, thereby forming a quantum dot obtained by allowing the anti-surfactant to react with the quantum-dot forming material on the first epitaxial layer; allowing the quantum dot to be moved onto a step of the first epitaxial layer due to a difference of surface energies between the quantum dot and the first epitaxial layer; and growing a second epitaxial layer on the first epitaxial layer.

13 Claims, 7 Drawing Sheets

METHOD FOR EPITAXIAL GROWTH

CROSS-REFERENCE TO RELATED APPLICATION

This application claims priority to Korean Patent Application No. 2009-5363, filed on 2009 Jan. 22, and all the benefits accruing therefrom under 35 U.S.C. §119, the contents of which in its entirety are herein incorporated by reference.

BACKGROUND

1. Field

This disclosure relates to a method for epitaxial growth, and more particularly, to a method for epitaxial growth, wherein a quantum dot is formed on an epitaxial layer using a quantum-dot forming material with an excellent lattice matching property, and the formed quantum dot is positioned on a defect in the epitaxial layer, thereby minimizing transfer of the defect into an epitaxial layer formed through a subsequent process.

2. Description of the Related Art

In formation of quantum dots on a substrate or epitaxial layer, when a quantum-dot forming material has a lattice constant similar to that of the epitaxial layer, i.e., when the quantum-dot forming material and the epitaxial layer are lattice-matched with respect to each other, the quantum dots are not formed well. To solve such a problem, there has been reported a method in which a surface treatment is performed by coating an anti-surfactant on an epitaxial layer, and quantum dots are grown on the epitaxial layer using a group III nitride-based material with an excellent lattice matching property through a vapor phase epitaxial process [*Appl. Phys. Lett* 69 (1996) pp. 4096].

As a method of forming quantum dots using such an anti-surfactant, Japanese Laid-open Patent Publication No. 1999-354843 proposes a technique which forms a crystal layer grown while burying quantum dots but suppressing unintended quantum dots. In addition, Japanese Registered Patent Publication No. 3660801 proposes a technique for a GaN-based semiconductor light emitting device using quantum dots, and Japanese Registered Patent Publication No. 3667995 proposes a technique for a method of fabricating quantum dots and their use. In the three techniques, a high-efficiency light emitting device can be obtained by optimizing the size of quantum dots and their entire distribution.

As described above, in related art techniques, production of unintended quantum dots is suppressed, or optical characteristics of quantum dots are applied to a light emitting device. However, the quantum dots may induce lattice defects due to the difference of lattice constants between the quantum dots and a thin film formed in a subsequent process.

SUMMARY

This disclosure provides a method for epitaxial growth, wherein a quantum dot is formed on an epitaxial layer using a quantum-dot forming material with an excellent lattice matching property, and the formed quantum dot is positioned on a defect in the epitaxial layer, thereby minimizing transfer of the defect into an epitaxial layer formed through a subsequent process.

In one aspect, there is provided a method for epitaxial growth, which includes preparing a first epitaxial layer having a defect formed therein on a substrate; coating an anti-surfactant on the first epitaxial layer; supplying a quantum-dot forming material lattice-matched with respect to the first epitaxial layer, thereby forming a quantum dot obtained by allowing the anti-surfactant to react with the quantum-dot forming material on the first epitaxial layer; allowing the quantum dot to be moved onto a step of the first epitaxial layer due to a difference of surface energies between the quantum dot and the first epitaxial layer; and growing a second epitaxial layer on the first epitaxial layer.

The second epitaxial layer may have a lattice constant corresponding to that of the first epitaxial layer. The mismatch of lattice constants between the first and second epitaxial layers may be within 10%

In the fourth operation, the quantum dot may be moved onto the step by thermally treating the substrate or by irradiating light onto the surface of the first epitaxial layer. The substrate may be thermally treated at a temperature of about 300 to 700° C. The light may have a wavelength of about 0.1 to 5 μm. The second to fifth operations may be repeated a plurality of times.

The anti-surfactant may be prepared by using a material including any one of silicon (Si), phosphorus (P) and boron (B). The anti-surfactant may be tetraethylsilane. The quantum dot may have a size of about 0.1 nm to 10 μm.

The first and second epitaxial layers may be made of a a tertiary compound semiconductor or a quaternary compound semiconductor, including any one of a binary compound semiconductor including any one of GaAs, AlAs, InAs, GaSb, AlSb, InSb, GaN, AlN, InN, GaP, AlP and InP, a tertiary compound semiconductor or a quaternary compound semiconductor, or is formed into a structure in which at least two of the tertiary or quaternary compound semiconductors are stacked.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

The entire process in a method for epitaxial growth disclosed herein is to grow a second epitaxial layer with the transfer of a defect formed in a first epitaxial layer thereto minimized. The transfer of the defect is suppressed by a quantum dot formed on the first epitaxial layer. A quantum-dot forming material and the first epitaxial layer are sufficiently lattice-matched with respect to each other. The first epitaxial layer may be a substrate.

The defect in the first epitaxial layer is a lattice defect such as a dislocation or a micro twin. To remove or minimize the lattice defect, a quantum dot is formed on the first epitaxial layer, and the corresponding quantum dot is positioned on the defect formed in the first epitaxial layer, so that the defect is repaired. Accordingly, the transfer of the defect to the second epitaxial layer formed on the first epitaxial layer is suppressed.

In the formation of the quantum dot on the first epitaxial layer, the quantum dot is formed by coating an anti-surfactant on the first epitaxial layer so that the quantum dot is easily formed and then allowing the anti-surfactant and the quantum-dot forming material to react with each other.

Hereinafter, a method for epitaxial growth according to an embodiment will be described in detail with reference to the accompanying drawings.

Figure 1:
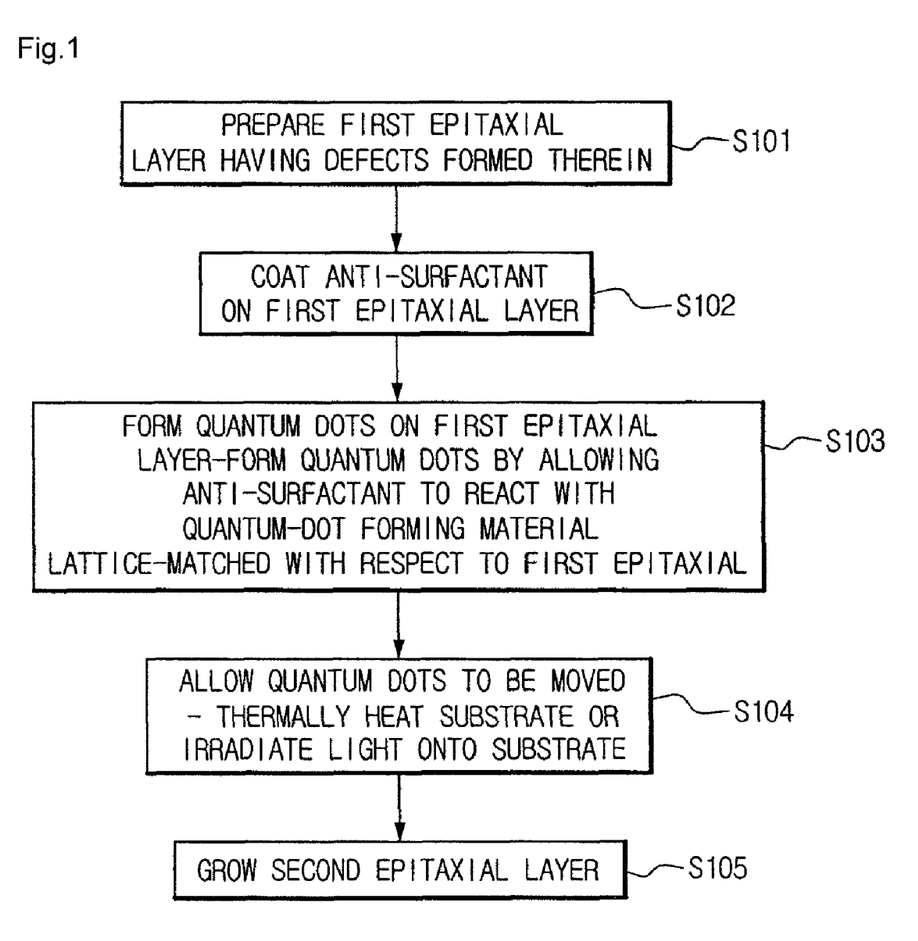
FIG. 1 is a flowchart illustrating a method for epitaxial growth according to an embodiment.
Figure 2:
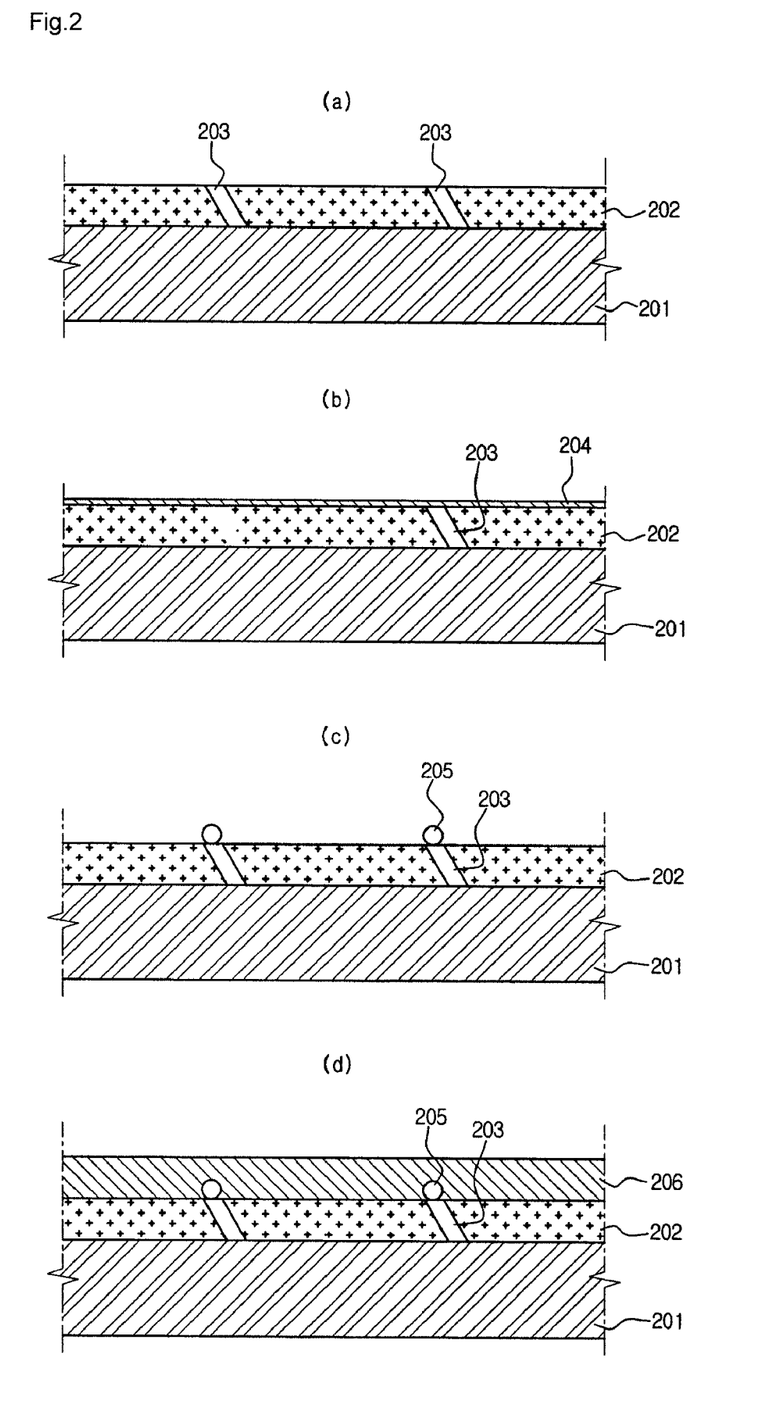
FIG. 2 shows cross-sectional views sequentially illustrating the method for epitaxial growth according to the embodiment.

FIG. 1 is a flowchart illustrating a method for epitaxial growth according to an embodiment. FIG. 2 shows cross-sectional views sequentially illustrating the method for epitaxial growth according to the embodiment.

As shown in FIG. 1 and (a) of FIG. 2, a first epitaxial layer 202 having defects formed therein is first prepared (S101). The first epitaxial layer 202 may be formed on a substrate 201, or the first epitaxial layer itself may be a substrate. Here, the first epitaxial layer 202 may be made of a binary compound semiconductor including any one of GaAs, AlAs, InAs, GaSb, AlSb, InSb, GaN, AlN, InN, GaP, AlP and InP, a tertiary compound semiconductor or a quaternary compound semiconductor. Alternatively, the first epitaxial layer 202 may be formed into a structure in which at least two of the tertiary or quaternary compound semiconductors are stacked.

Figure 4:
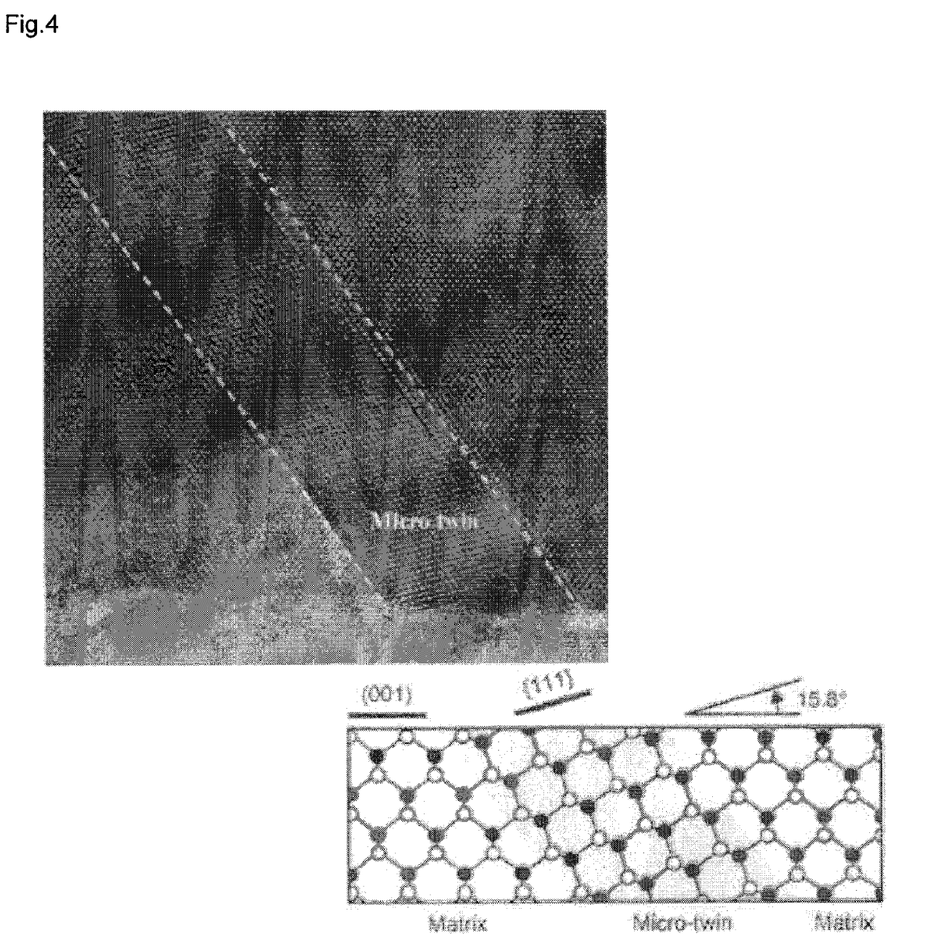
FIG. 4 shows a transmission electron microscopy (TEM) photograph and an atomic layout, showing a defect in a single crystalline layer grown on a substrate having a lattice constant different from that of the single crystalline layer.
Figure 5A:
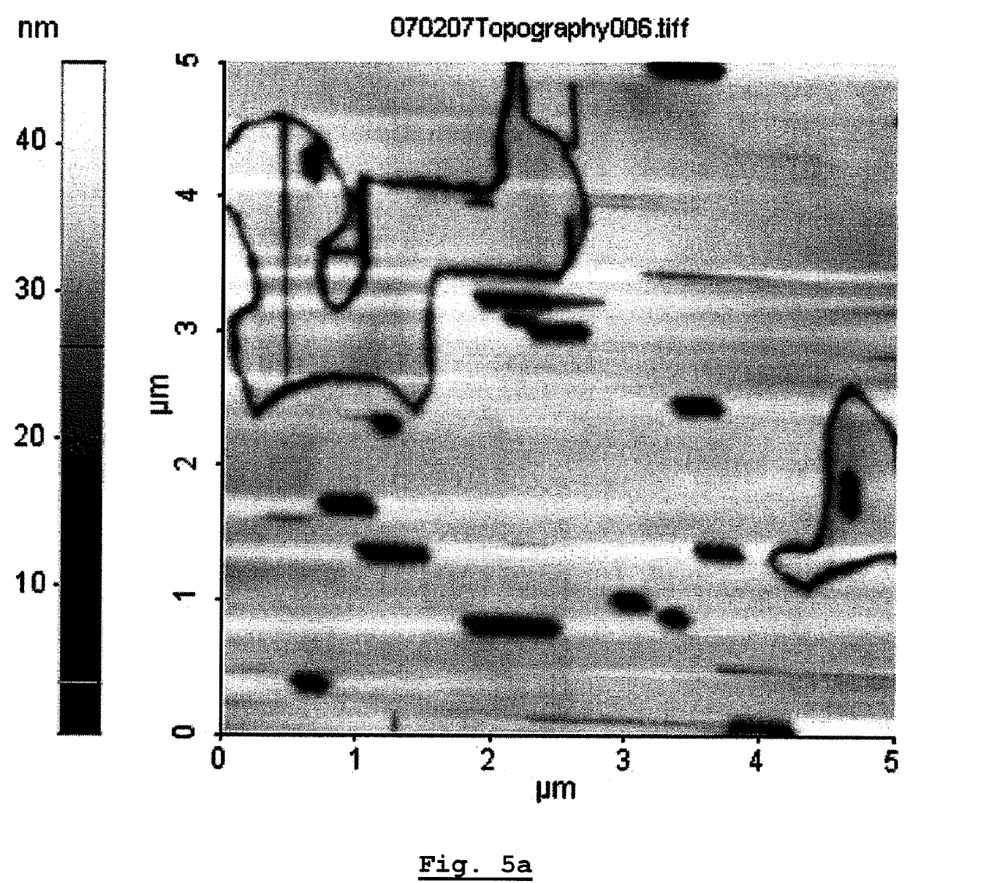
FIG. 5a is an atomic force microscopy (AFM) photograph showing a defect in a single crystalline layer grown on a substrate having a lattice constant different from that of the single crystalline layer.
Figure 5B:
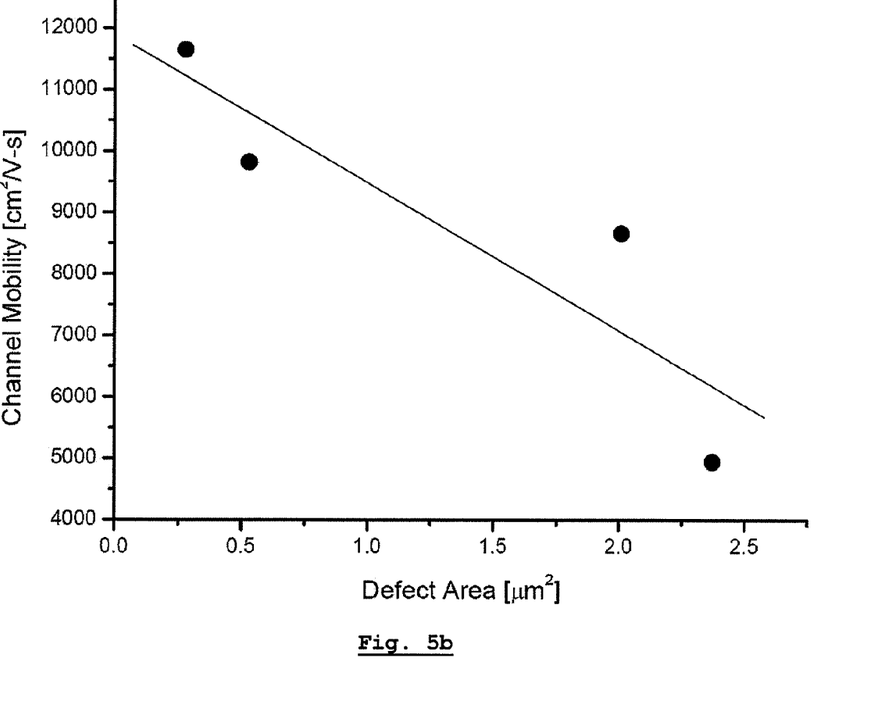
FIG. 5b is a graph showing characteristics of electron mobility depending on defect areas.

When the first epitaxial layer is formed on the substrate 201, the lattice constants of the substrate 201 and the first epitaxial layer 202 are different from each other. Therefore, when the first epitaxial layer 202 is grown to a critical thickness or larger, defects 203 such as dislocations or micro twins are produced in the first epitaxial layer 202 grown on the substrate 201. For example, if a first single crystalline layer having a different lattice constant is grown on a substrate having a plane index of (001), a defect grown in a direction of {111} different from the crystal direction of the substrate, i.e., a micro twin is produced as shown in FIG. 4. For reference, the drawing shown at an upper portion of FIG. 4 is a transmission electron microscopy (TEM) photograph showing a micro twin of a single crystalline layer formed on a substrate, and the drawing shown at a lower portion of FIG. 4 is a view showing atomic arrangement extended from the TEM photograph. Referring to an atomic force microscopy (AFM) photograph of FIG. 5a, the area of defects produced can be obtained, and it can be seen that electron mobility is decreased as shown in FIG. 5b. As the growth thickness of the first epitaxial layer 202 is increased, a surface step is enlarged. Accordingly, the first epitaxial layer 202 may be grown to a thickness of 100 μm or smaller, and the growth temperature of the first epitaxial layer 202 may be set as about 200 to 1200° C.

Figure 6A:
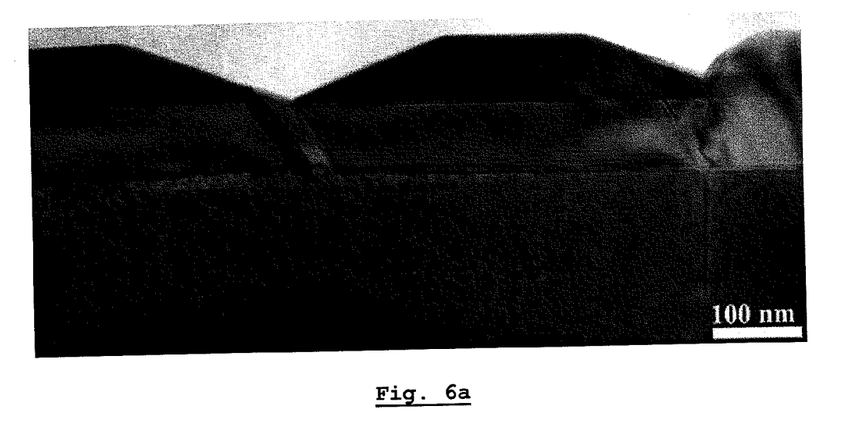
FIG. 6a is a TEM photograph showing the cross-section of a structure in which a second single crystalline layer is grown on a first single crystalline layer in which a defect is not repaired.
Figure 6B:
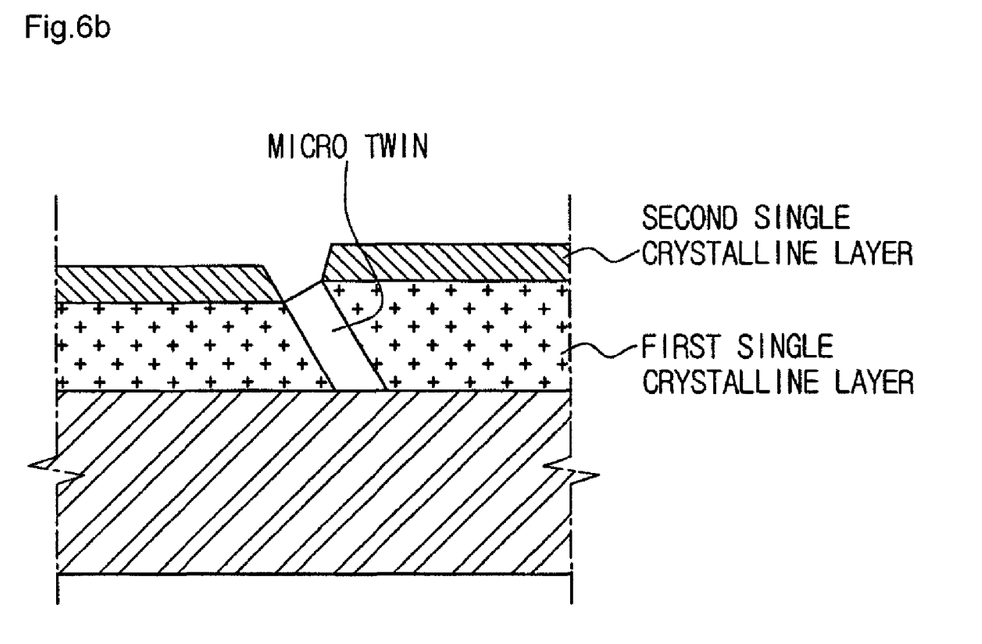
FIG. 6b is a reference diagram showing the second single crystalline layer partially grown by the defect in the first single crystalline layer.

Meanwhile, if a second single crystalline layer is grown on the first single crystalline layer using a material with a lattice constant similar to that of the first single crystalline layer in the state that a defect such as a micro twin is produced as shown in FIG. 4, the second single crystalline layer is not grown on a surface of the first epitaxial layer having a defect formed therein as shown in FIGS. 6a and 6b, even though the lattice constants of the first and second single crystalline layers are similar to each other. This is because the lattice constant of the first single crystalline layer having the defect formed therein is different from that of the first single crystalline layer that grows normally. Therefore, to prevent the defect in the first single crystalline layer from being transferred to the second single crystalline layer, it is required to allow the lattice constant of the entire surface of the first single crystalline layer to be uniformly maintained.

This disclosure provides a method in which an anti-surfactant 204 is coated on a first epitaxial layer 202 so that the lattice constant of the entire surface of the first epitaxial layer 202 is uniformly maintained, a quantum-dot forming material is provided on the anti-surfactant 204 so as to form a quantum dot 205 obtained by allowing the anti-surfactant 204 and the quantum-dot forming material to react with each other, and the quantum dot 205 is then moved onto a surface of the first epitaxial layer 202 having a defect 203 formed therein so as to repair the corresponding defect 203, thereby allowing the entire surface of the first epitaxial layer 202 to have a uniform lattice constant.

Specifically, the anti-surfactant 204 is first coated on the first epitaxial layer 202 (S102) (see (b) of FIG. 2). The anti-surfactant 204 may be prepared by using a material including any one of silicon (Si), phosphorus (P) and boron (B). For example, the anti-surfactant 204 may be tetraethylsilane. In detail, the anti-surfactant is coated on the first epitaxial layer 202 by supplying the anti-surfactant at a speed of 0.1 to 10 nm/min in the state that the substrate is located in a chamber. When the supply speed of the anti-surfactant is less than 0.1 nm/min, the anti-surfactant may not be absorbed on the surface of the first epitaxial layer 202. When the supply speed of the anti-surfactant is more than 10 nm/min, the surface of the first epitaxial layer 202 may be rough or may not have a nano structure.

After the anti-surfactant 204 is coated on the first epitaxial layer 202, a quantum-dot forming material is supplied into the chamber, and the quantum-dot forming material and the anti-surfactant 204 are then reacted with each other, thereby forming quantum dots 205 (S103) (see (c) of FIG. 2). The quantum-dot forming material may include a material sufficiently lattice-matched with respect to the first epitaxial layer 202. The formed quantum dots 205 are arranged on the first epitaxial layer 202 through self-assembly. For reference, the quantum dots 205 may have a size of about 0.1 nm to 10 µm.

Figure 3:
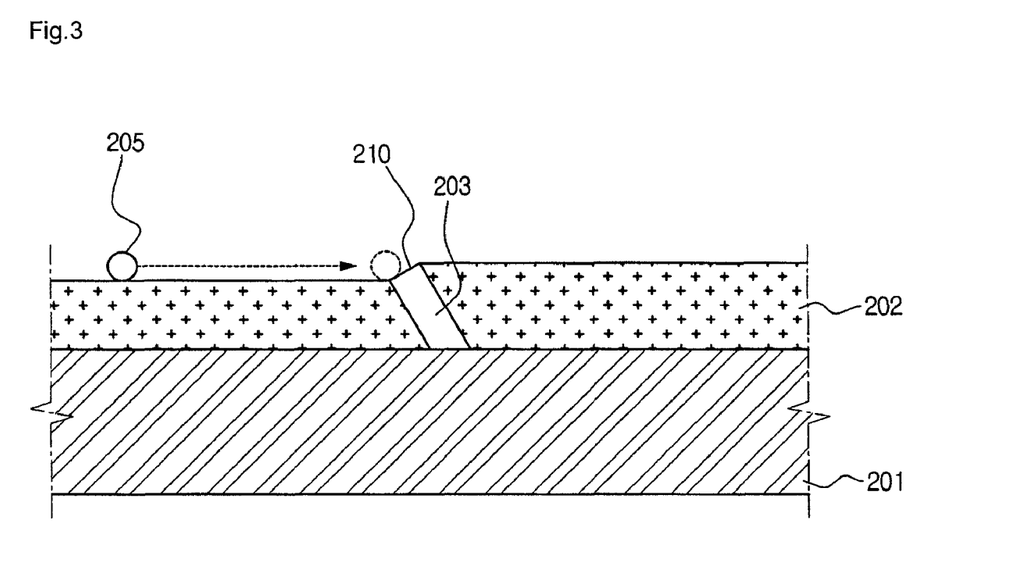
FIG. 3 is a reference diagram showing a quantum dot moved onto a step by surface energy according to the embodiment.

Meanwhile, a surface (hereinafter, referred to as a step 210) of the first epitaxial layer 202 having a defect formed therein has a surface energy lower than that of the first epitaxial layer 202 which grows normally. Accordingly, the quantum dot 205 formed on the first epitaxial layer 202 is moved onto the step 210 having a relatively low surface energy (see FIG. 3). Consequently, the entire surface of the first epitaxial layer 202 has a relatively uniform lattice constant (S104). That is, the quantum dot 205 is moved onto the step 210, and therefore, the defect in the first epitaxial layer 202 is repaired.

To increase a driving force in allowing the quantum dot 205 to be moved onto the step 210, the substrate may be thermally treated, or light may be irradiated onto the substrate (S104). Specifically, the substrate may be heated at a temperature of about 300 to 700° C. so as to promote the movement of the quantum dot 205, or light having a wavelength of about 0.1 to 5 µm may be irradiated onto the surface of the first epitaxial layer 202 so as to accelerate the movement of the quantum dot 205 onto the step 210.

In the state that the defect in the first epitaxial layer is repaired by the quantum dot 205, i.e., in the state that the entire surface of the first epitaxial layer 202 has a uniform lattice constant, a second epitaxial layer 206 having a lattice constant equal or similar to that of the first epitaxial layer 202 is grown on the first epitaxial layer 202 (S105) (see (d) of FIG. 2). At this time, the defect in the first epitaxial layer 202 is prevented from being transferred by the quantum dot 205 located on the step 210. Accordingly, the second epitaxial layer 206 is epitaxially grown in the state that defects are minimized. For reference, the second epitaxial layer 206 may be made of a binary compound semiconductor including any one of GaAs, AlAs, InAs, GaSb, AlSb, InSb, GaN, AlN, InN, GaP, AlP and InP, a tertiary compound semiconductor or a quaternary compound semiconductor. Alternatively, the second epitaxial layer 206 may be formed into a structure in which at least two of the tertiary or quaternary compound semiconductors are stacked. The first and second epitaxial layers 202 and 206 may be made of different materials. In this case, to minimize defects in the second epitaxial layer 206, the mismatch of lattice constants between the first and second epitaxial layers 202 and 206 may be limited to within 10%.

A series of unit processes including application of the anti-surfactant 204, formation of the quantum dots and growth of the second epitaxial layer 206 may be repeatedly performed to minimize a concentration of defects in the second epitaxial layer 206.

As described above, the stacked structure of epitaxial layers fabricated according to the embodiment may be applied to semiconductor devices and the like. Such semiconductor devices may be applied to circuits, systems and the like. Further, the aforementioned stacked structure of epitaxial layers may be formed on a lower surface of a substrate as well as on an upper surface of the substrate. Such a stacked structure may be applied to semiconductor devices, circuits, and systems.

A method for epitaxial growth disclosed herein provides the following advantageous effect.

A quantum dot is formed on an epitaxial layer by allowing a quantum-dot forming material having an excellent lattice matching property to react with an anti-surfactant, and the quantum dot is moved onto a defect in the epitaxial layer through thermal treatment, laser irradiation, or the like, so that the transfer of the defect to an epitaxial layer formed through a subsequent process is suppressed.

While the exemplary embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A method for epitaxial growth, comprising:
preparing a first epitaxial layer having a defect formed therein on a substrate;
coating an anti-surfactant on the first epitaxial layer;
supplying a quantum-dot forming material lattice-matched with respect to the first epitaxial layer, thereby forming a quantum dot obtained by allowing the anti-surfactant to react with the quantum-dot forming material on the first epitaxial layer;
allowing the quantum dot to be moved onto a step of the first epitaxial layer due to a difference of surface energies between the quantum dot and the first epitaxial layer; and
growing a second epitaxial layer on the first epitaxial layer.

2. The method according to claim 1, wherein the second epitaxial layer has a lattice constant corresponding to that of the first epitaxial layer.

3. The method according to claim 1, wherein a mismatch of lattice constants between the first and second epitaxial layers is within 10%.

4. The method according to claim 1, wherein, in the fourth operation, the quantum dot is moved onto the step by thermally treating the substrate.

5. The method according to claim 4, wherein the substrate is thermally treated at a temperature of 300 to 700° C.

6. The method according to claim 1, wherein, in the fourth operation, the quantum dot is moved onto the step by irradiating light onto the surface of the first epitaxial layer.

7. The method according to claim 6, wherein the light has a wavelength of 0.1 to 5 µm.

8. The method according to claim 1, wherein the anti-surfactant is prepared by using a material including any one of silicon (Si), phosphorus (P) and boron (B).

9. The method according to claim 8, wherein the anti-surfactant is tetraethylsilane.

10. The method according to claim 1, wherein the quantum dot has a size of 0.1 nm to 10 µm.

11. The method according to claim 1, wherein the second to fifth operations are repeated a plurality of times.

12. The method according to claim 1, wherein the first epitaxial layer is made of a binary compound semiconductor including any one of GaAs, AlAs, InAs, GaSb, AlSb, InSb, GaN, AlN, InN, GaP, AlP and InP, a tertiary compound semiconductor or a quaternary compound semiconductor, or is formed into a structure in which at least two of the tertiary or quaternary compound semiconductors are stacked.

13. The method according to claim 1, wherein the second epitaxial layer is made of a binary compound semiconductor including any one of GaAs, AlAs, InAs, GaSb, AlSb, InSb, GaN, AlN, InN, GaP, AlP and InP, a tertiary compound semiconductor or a quaternary compound semiconductor, or is formed into a structure in which at least two of the tertiary or quaternary compound semiconductors are stacked.

* * * * *